United States Patent
Yatsushiro et al.

(10) Patent No.: US 11,264,068 B2
(45) Date of Patent: Mar. 1, 2022

(54) APPARATUSES AND METHODS FOR SEMICONDUCTOR DEVICES INCLUDING CLOCK SIGNAL LINES

(71) Applicant: MICRON TECHNOLOGY, INC., Boise, ID (US)

(72) Inventors: Ryosuke Yatsushiro, Tokyo (JP); Seiji Narui, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/122,801

(22) Filed: Dec. 15, 2020

(65) Prior Publication Data

US 2021/0104269 A1    Apr. 8, 2021

Related U.S. Application Data

(63) Continuation of application No. 16/591,461, filed on Oct. 2, 2019, now Pat. No. 10,885,959.

(51) Int. Cl.
*G11C 5/06* (2006.01)
*G11C 7/22* (2006.01)
(Continued)

(52) U.S. Cl.
CPC ............ *G11C 7/222* (2013.01); *G11C 7/1069* (2013.01); *G11C 7/1096* (2013.01); *G11C 8/18* (2013.01);
(Continued)

(58) Field of Classification Search
CPC ....... G11C 5/063; G11C 7/18; G11C 11/4097; G11C 5/025; G11C 5/04
(Continued)

(56) References Cited

U.S. PATENT DOCUMENTS 7,323,789 B2    1/2008  Seki et al.
8,125,812 B2 *  2/2012  Streibl ................... G06F 1/10
                                                           365/51
(Continued)

FOREIGN PATENT DOCUMENTS

KR    20150102086 A    9/2015
KR    20150128600 A    11/2015
WO     2021067312 A1    4/2021

OTHER PUBLICATIONS

U.S. Appl. No. 16/591,461 titled "Apparatuses and Methods for Semiconductor Devices Including Clock Signal Lines" filed Oct. 2, 2019.
(Continued)

*Primary Examiner* — Son T Dinh
(74) *Attorney, Agent, or Firm* — Dorsey & Whitney LLP

(57) ABSTRACT

Apparatuses for providing a clock signal for a semiconductor device are described. An example apparatus includes a chip including a first clock tree and a second clock tree. The first clock tree includes a first wiring segment extending in a first direction and a second wiring segment extending in a second direction perpendicular to the first direction and coupled the first wiring segment. The second clock tree includes a third wiring segment extending in the second direction, a fourth wiring segment extending in the first direction and coupled to the third wiring segment, and a fifth wiring segment extending in the second direction and coupled to the fourth wiring segment.

20 Claims, 13 Drawing Sheets

(51) Int. Cl.
  *G11C 8/18* (2006.01)
  *G11C 7/10* (2006.01)
  *H01L 25/065* (2006.01)
  *H01L 25/18* (2006.01)

(52) U.S. Cl.
  CPC .......... *H01L 25/0657* (2013.01); *H01L 25/18* (2013.01); *H01L 2225/06541* (2013.01)

(58) Field of Classification Search
  USPC .......................................... 365/63, 51, 233.1
  See application file for complete search history.

(56) References Cited

U.S. PATENT DOCUMENTS

| | | | |
|---|---|---|---|
| 9,559,040 B2 | 1/2017 | Batra et al. | |
| 10,014,320 B2* | 7/2018 | Kanno | G06F 30/39 |
| 10,236,051 B2* | 3/2019 | Ware | G06F 1/06 |
| 10,854,271 B2* | 12/2020 | Tsukihashi | G11C 11/4093 |
| 10,885,959 B1 | 1/2021 | Yatsushiro et al. | |
| 2002/0014898 A1* | 2/2002 | Ikeda | H03K 19/1735 326/101 |
| 2005/0012520 A1 | 1/2005 | Or-Bach | |
| 2014/0103959 A1 | 4/2014 | Andreev et al. | |
| 2018/0331037 A1 | 11/2018 | Mohammed et al. | |

OTHER PUBLICATIONS

"International Search Report and Written Opinion for PCT/US2020/053338, dated Jan. 15, 2021".

* cited by examiner

APPARATUSES AND METHODS FOR SEMICONDUCTOR DEVICES INCLUDING CLOCK SIGNAL LINES

CROSS-REFERENCE TO RELATED APPLICATION (S)

This application is a continuation of U.S. patent application Ser. No. 16/591,461 filed on Oct. 2, 2019. This application is incorporated by reference herein in its entirety and for all purposes.

BACKGROUND

High data reliability, high speed of memory access, lower power consumption and reduced chip size are features that are demanded from semiconductor memory. To achieve higher memory access speed, a metal layer that provides low impedance and high conductivity has been increasingly used in semiconductor memory devices, to couple, for example, pads and data queue circuits (or data input/output circuits) across layers. In conventional peripheral circuitries for a semiconductor memory device, data queue circuits (or data input/output circuits) are arranged in a corresponding manner across layers of each chip. An example of a semiconductor memory device is a high bandwidth memory (HBM) that includes a plurality of memory core chips stacked on one or more interface chips.

Each data queue circuit or data input/output circuit is called collectively "DQ circuit" hereinafter. Each memory core chip includes the DQ circuit. The DQ circuit typically includes a number of clock signal lines for providing clock signals, such as a write clock signal (WCLK), a read clock signal (RCLK), clock signals for input pointers and output pointers in a read First-In First-Out (FIFO) circuit, and a write clock signal and a read clock signal provided on through silicon vias (TSVs) between chips. These clock signal lines and the DQ circuits are generally located in the same region (e.g., the center region) for a wiring layer of each chip, and as a result, the region is crowded with circuits and signal lines. Similarly, the same region for a polycrystalline silicon layer is also crowded with a number of drivers coupled to the number of clock signal lines.

DETAILED DESCRIPTION OF PREFERRED EMBODIMENTS

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
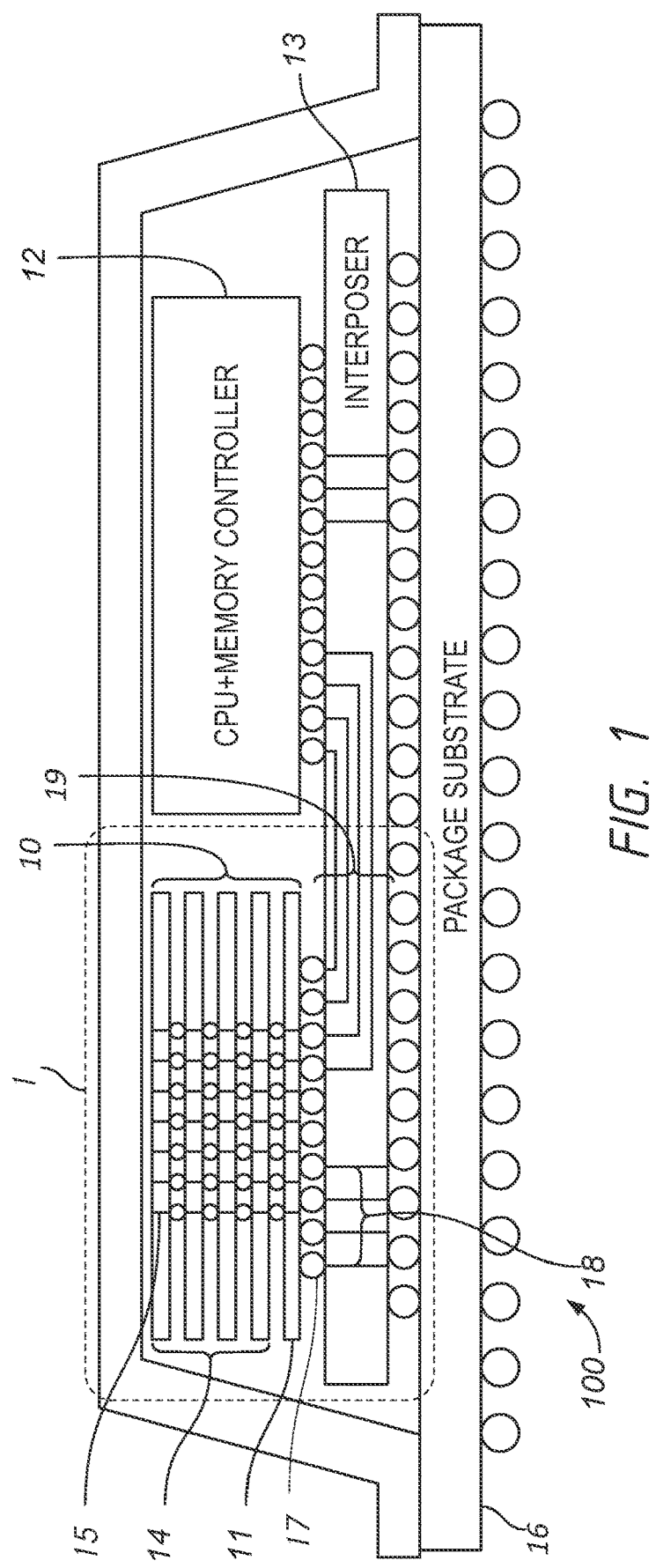
FIG. 1 is a schematic diagram of a semiconductor system including a semiconductor memory device in accordance with an embodiment of the present disclosure.

FIG. 1 is a schematic diagram of a semiconductor system 100 including an apparatus, which is a semiconductor memory device 1 in accordance with an embodiment of the present disclosure. The semiconductor system 100 may also include a central processing unit (CPU) and memory controller 12, which may be a controller chip, on an interposer 13 on a package substrate 16. The interposer 13 may include one or more power lines 18 which may supply power supply voltage from the package substrate 16. The interposer 13 may include a plurality of channels 19 that may interconnect the CPU and memory controller 12 and the semiconductor memory device 1. For example, the semiconductor memory device 1 may be an Hybrid Memory Cube (HMC), High Bandwidth Memory (HBM), and a wide-I/O dynamic random access memory (DRAM), etc. The memory controller 12 may provide a clock signal, a command signal, and may further transmit and receive data signals. The plurality of channels 19 may transmit the data signals between the memory controller and the semiconductor memory device 1. The semiconductor memory device 1 may include a plurality of chips 10 including an interface (IF) chip 11 and a plurality of memory core chips 14 stacked with each other. Please note that a number of the plurality of memory core chips 14 may not be limited to 4 and may be more or fewer as appropriate. Each of the memory core chip 14 may include a plurality of memory cells and circuitries accessing the memory cells. For example, the memory cells may be a dynamic random access memory (DRAM) memory cells. The semiconductor memory device 1 may include conductive vias TSVs 15 (e.g., through substrate electrodes) which couple the I/F chip 11 and the plurality of memory core chips 14 by penetrating the I/F chip 11 and the plurality of memory core chips 14. The IF chip 11 may be coupled to the interposer 13 via interconnects, such as bumps 17. For example, the bumps 17 may be microbumps having bump pitches of less than about or less than one hundred micro meters and exposed on an outside of the IF chip 11. A portion of the bumps 17 may be coupled to the one or more power lines 18. Another portion of the bumps 17 may be coupled to the plurality of channels 19.

Figure 2:
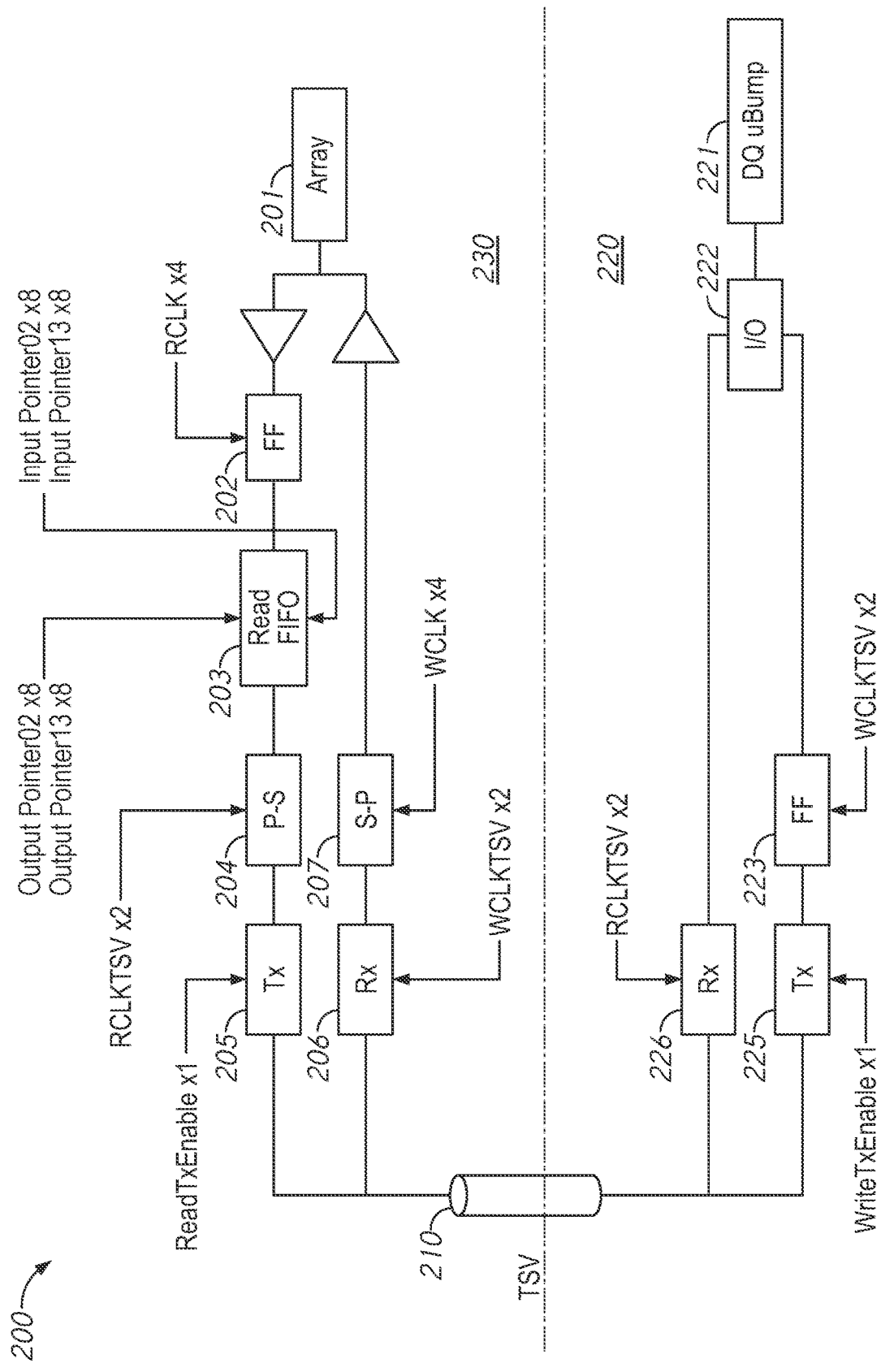
FIG. 2 is a block diagram of a semiconductor memory device in accordance with an embodiment of the present disclosure.

FIG. 2 is a block diagram of a semiconductor memory device 200 in accordance with an embodiment of the present disclosure. For example, the semiconductor memory device 200 may be the semiconductor memory device 1. The semiconductor memory device 200 may include an interface (I/F) chip 220 and at least one memory core chip 230. For example, the I/F chip 220 may be the I/F chip 11 in FIG. 1, and the at least one memory core chip 230 may be one of the plurality of memory core chips 14 in FIG. 1. The I/F chip 220 may communicate data with a memory controller (e.g., the memory controller 22) through a data input/output (I/O) circuit 222 either receiving or transmitting data through data queue (DQ) microbumps 221. For example, the DQ microbumps 221 may be the bumps 17 in FIG. 1. The I/F chip 220 may receive a clock signal from the memory controller and may further provide two write clock signals for TSVs 210 (WCLKTSV) and two read clock signals for the TSVs 210 (RCLKTSV). The WCLKTSV and RCLKTSV signals may be used for data transmission through the TSVs 210 that may interconnect the IF chip 220 and the memory core chip 230. In some embodiments of the disclosure, the I/F chip 220 may include a time adjustment circuit (not shown) that may adjust the clock signal received from the memory controller and may adjust the clock signal based on delays in the I/F chip 220, in the TSVs 210, and/or the at least one memory core chip 230. The time adjustment circuit in the I/F chip 220 may provide the WCLKTSV and RCLKTSV signals after the adjustment throughout the semiconductor memory device 200.

When data is to be written to a memory cell in a memory cell array 201 of the at least one memory core chip 230, the data I/O circuit 222 may receive the data at the DQ microbumps 221. The I/F chip 220 may further include a flip-flop (FF) circuit 223 and a transmitter (Tx) 225 in a write path in addition to the data I/O circuit 222. The FF circuit 223 may temporarily store the data in order to regulate a timing suitable for transmission with the at least one memory core chip 220 via through substrate vias (TSVs) 210 that may interconnect the I/F chip 220 and the memory core chip 230. For example, the FF circuit 223 may receive the data and the two WCLKTSV signals, and may further provide the data to the transmitter 225 responsive to the two WCLKTSV signals. The transmitter 225 may receive the data from the FF circuit 223 and provide the data to the TSVs 210 responsive to a write transmission enable signal WriteTxEnable being in an active status. For example, the TSVs 210 may be the conductive vias TSVs 15 which couple the I/F chip 11 and the plurality of memory core chips 14. The at least one memory core chip 230 may include a receiver Rx 206 and a serial to parallel converter (S-P) 207 in a write path. The receiver 206 may receive the two WCLKTSV signals. The transmitter 225 may receive the data from the I/F chip 220 via the TSVs 210 and provide the data to the serial to parallel converter 207 responsive to the two WCLKTSV signals. The serial to parallel converter 207 may receive the data from the receiver 206 and convert the data transmitted in a serial data format into a parallel data format to be provided to the memory cell array 201 in a set of parallel signal lines. The serial to parallel converter 207 may receive four write clock signals (WCLK) to regulate timing of writing data within the memory core chip 230, and may provide the converted data responsive to the four WCLK signals. In some embodiments of the disclosure, the serial to parallel converter 207 may be a shift register including a plurality of FF circuits. The converted data in the parallel format may be provided to the memory cell array 201 through a buffer.

When data is to be read from a memory cell in the memory cell array 201 of the at least one memory core chip 230, an FF circuit 202 may receive the data from the memory cell array 201 through a buffer, as well as four read clock signals (RCLK) to regulate timing of reading data within the memory core chip 230. The memory core chip 230 may include the FF circuit 202, a read First-In-First-Out (FIFO) circuit 203, a parallel to serial converter (P-S) 204 and a transmitter Tx 205 in a read path. The FF circuit 202 may provide the data responsive to the four RCLK signals to the read FIFO circuit 203. The read FIFO circuit 203 may receive the data, two kinds of input pointers (input pointer 02 and input pointer 13), each having eight signals, and two kinds of output pointers (output pointer 02 and output pointer 13), each having eight signals. The eight input pointer 02 signals and the eight input pointer 13 signals may be used to regulate timing of receiving (inputting) the data from the FF circuit 202 to the Read FIFO circuit 203. The eight output pointer 02 signals and the eight output pointer 13 signals may be used to regulate timings of providing (outputting) the data from the read FIFO circuit 203 to the parallel to serial converter 204. The parallel to serial converter 204 may receive the data from the read FIFO circuit 203 and convert the data transmitted in a parallel data format from the memory cell array 201 into a serial data format to be provided to TSVs 210. The parallel to serial converter 204 may receive the RCLKTSV signals to regulate timing of transmitting data through the TSVs 210, and may provide the data responsive to the two RCLKTSV signals. For example, the parallel to serial converter 204 may be a shift register including a plurality of FF circuits. The converted data in the serial format may be provided to the transmitter 205. The transmitter 205 may receive the converted data from the parallel to serial converter 204 and a read transmission enable signal ReadTxEnable, and may further provide the converted data to the TSVs 210 responsive to the ReadTxEnable signal. The IF chip 220 may include a receiver Rx 226 coupled to the data I/O circuit 222 in a read path. The receiver 226 may receive the data from the TSVs 210 as well as the two RCLKTSV signals, and may provide the data responsive to the two RCLKTSV signals to the data I/O circuit 222. The data I/O circuit 222 may provide the data to be read through the DQ microbumps 221 to the memory controller.

Since the TSVs 210 may transmit the data to be written, the data to be read as well as the two WCLKTSV signals and the two RCLKTSV signals, the WCLKTSV and RCLKTSV signals are common across the IF chip 220 and the at least one of memory core chips 230.

Figure 3A:
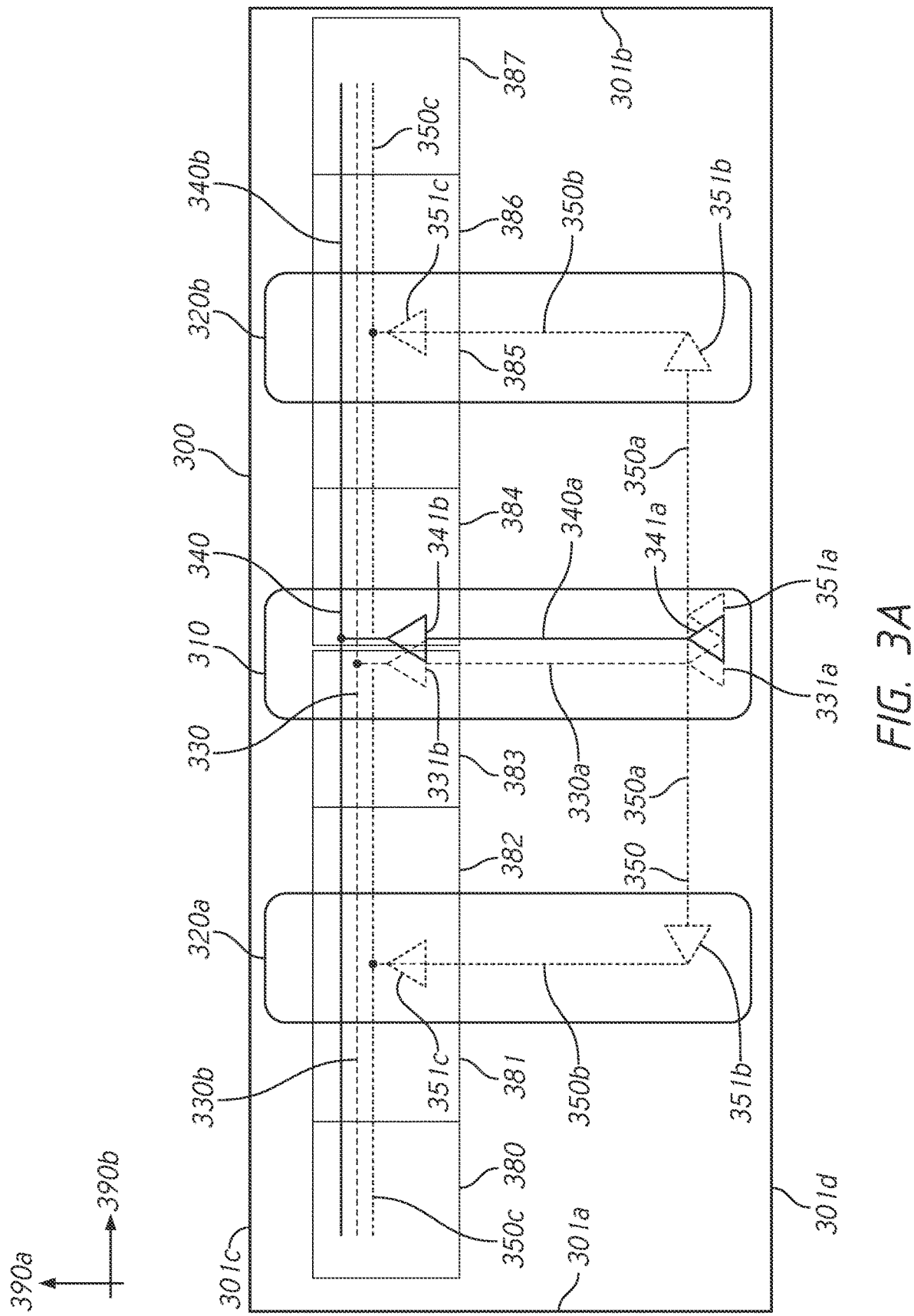
FIG. 3A is a layout diagram of clock trees of a memory core chip in accordance with an embodiment of the present disclosure.

FIG. 3A is a layout diagram of clock trees on a portion 300 of a data queue (DQ) block of a memory core chip in accordance with an embodiment of the present disclosure. For example, the memory core chip may be the memory core chip 200. The portion 300 of the memory core chip may include sides 301a and 301b that may extend in a first direction 390a. The portion 300 of the memory core chip may also include sides 301c and 301d that may extend in a direction 390b that is perpendicular to the first direction 390a. The portion 300 of the memory core chip may include a center region 310, side regions 320a and 320b disposed between the sides 301c and 301d. The center region 310 may be disposed between the side regions 320a and 320b. The side region 320a may be disposed between the side 301a and the center region 310. The side region 320b may be disposed between the side 301b and the center region 310. The portion 300 of the memory core chip may include a plurality of data queue (DQ) core cells 380-387 for receiving or providing data. The portion 300 of the DQ block may include a plurality of clock signal lines 330, 340 and 350. The plurality of clock signal lines 330, 340 and 350 may be included in a wiring layer that includes one or more metal layers.

A portion 330 of the clock signal lines including wirings on one or more metal layers (e.g. Metal1, Metal2, Metal3) may include a wiring segment 330a that may extend in the direction 390a in the center region 310 and a wiring segment 330b that may extend in directions perpendicular to the direction 390a. For example, the wiring segment 330b may extend in a direction opposite to the direction 390b and in the direction 390b from the center region 310 to the side regions 320a and 320b to provide a plurality of clock signals to the plurality of DQ core cells 380-383 and 383-387, respectively. The wiring segment 330b is shown as one wiring segment in FIG. 3A, however, the portion 330 may include a plurality of wiring segments perpendicular to the wiring segment 330a and aligned in parallel to the wiring segment 330b. The wiring segment 330a may be coupled to a clock driver 331a. In some embodiments of the disclosure, the wiring segment 330a is coupled to the clock driver 331a at around the side 301d on a semiconductor layer. The semiconductor layer may be a polycrystalline silicon layer. The wiring segment 330a may be further coupled to a clock driver 331b in the direction 390a from the clock driver 331a, on a semiconductor layer. The portion 330 of the clock signal lines having the wiring segment 330a, and further having the wiring segment 330b may be referred to as an I type clock tree. The wiring segment 330a may provide the plurality of clock signals from the clock driver 331a to the clock driver 331b in the center region 310. The wiring segment 330b may provide the plurality of clock signal from the clock driver 331b in the center region to the DQ core cells 380-383 and 383-387 towards the sides 301a and 301b.

Figure 4:
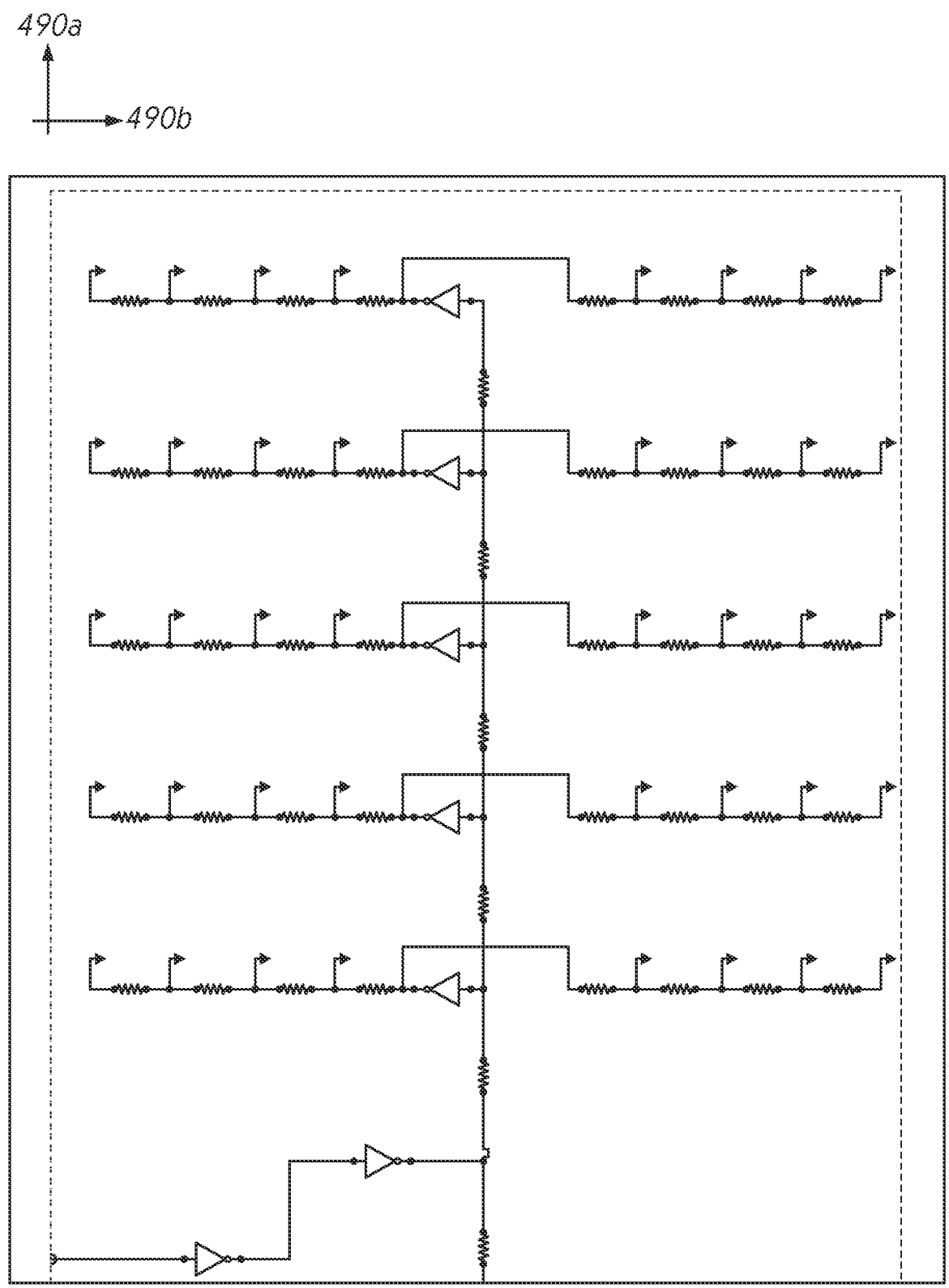
FIG. 4 is a circuit diagram of an I type clock tree in accordance with an embodiment of the present disclosure.

Similarly, a portion 340 of the clock signal lines including wirings on one or more metal layer (e.g. Metal1, Metal2, Metal3) may include a wiring segment 340a that may extend in the direction 390a in the center region 310 and a wiring segment 340b that may extend in directions perpendicular to the direction 390a. For example, the wiring segment 340b extends in the direction opposite to the direction 390b and in the direction 390b from the center region 310 to the side regions 320a and 320b to provide another plurality of clock signals to the plurality of DQ core cells 380-383 and 384-387, respectively. The plurality of clock signals provided by the wiring segment 340b are different from the plurality of clock signals provided by the portion 330 of the clock signal lines. The wiring segment 340b is shown as one wiring segment in FIG. 3A, however, the portion 340 may include a plurality of wiring segments perpendicular to the wiring segment 340a and aligned in parallel to the wiring segment 340b. The wiring segment 340a may be coupled to a clock driver 341a. In some embodiments of the disclosure, the wiring segment 340a is coupled to the clock driver 341a at around the side 301d on the semiconductor layer. The wiring segment 340a may be further coupled to a clock driver 341b disposed in the direction 390a from the clock driver 341a on the semiconductor layer. The portion 340 of the clock signal lines having the wiring segment 340a, and further having the wiring segment 340b may also be referred to as a clock tree of I type. The wiring segment 340a may provide the plurality of clock signals from the clock driver 341a to the clock driver 341b in the center region 310. The wiring segment 340b may provide the plurality of clock signal from the clock driver 341b in the center region 310 to the DQ core cells 380-383 and 383-387 towards the sides 301a and 301b. FIG. 4 is a circuit diagram of the I type clock tree in accordance with an embodiment of the present disclosure.

A portion 350 of the clock signal lines including wirings on one or more metal layers (e.g. Metal1, Metal2, Metal3) may include a wiring segment 350a that may extend in directions perpendicular to the direction 390a. For example, the wiring segment 350a may extend in the direction opposite to the direction 390b and in the direction 390b from the center region 310 to the side regions 320a and 320b to provide another plurality of clock signals from a clock driver 351a to clock drivers 351b. The other plurality of clock signals provided by the wiring segment 350a are different from the plurality of clock signals provided by the portions 330 and 340. The clock drivers 351b, coupled to the wiring segment 350a, may receive the other plurality of clock signals from the wiring segment 350a. The clock driver 351b may be further coupled to wiring segments 350b. The clock driver 351b may provide the other plurality of clock signals on the wiring segments 350b to clock drivers 351c in the side regions 320a and 320b. The portion 350 of the clock signal lines may further include wiring segments 350c coupled to the clock drivers 351c.

For example, the wiring segment 350c coupled to the clock driver 351c in the side region 320a may extend in the directions perpendicular to the direction 390a, including the direction opposite to the direction 390b and the direction 390b from the side region 320a to the side 301a and the center region 310. Thus, the clock driver 351c in the side region 320a may provide the other plurality of clock signals from the wiring segment 350b in the side region 320a to the DQ core cells 380 and 381 via the wiring segment 350c, which is coupled to the clock driver 351c in the side region 320a. The clock driver 351c in the side region 320a may further provide the other plurality of clock signals from the wiring segment 350b in the side region 320a to the DQ core cells 382 and 383 via the wiring segment 350c coupled to the clock driver 351c in the side region 320a.

Similarly, the wiring segment 350c coupled to the clock driver 351c in the side region 320b may extend in the directions perpendicular to the direction 390a, including the direction opposite to the direction 390b and the direction 390b from the side region 320b to the center region 310 and the side 301b. Thus, the clock driver 351c in the side region 320b may provide the other plurality of clock signals from the wiring segment 350b in the side region 320b to the DQ core cells 384 and 385 via the wiring segment 350c coupled to the clock driver 351c in the side region 320b. The clock driver 351c in the side region 320b may further provide the other plurality of clock signals from the wiring segment 350b in the side region 320a to the DQ core cells 386 and 387 via the wiring segment 350c coupled to the clock driver 351c in the side region 320b.

Here, one wiring segment 350c is coupled to each wiring segment 350b in the example of FIG. 3A. However, in some embodiments of the disclosure, a plurality of wiring segments perpendicular to the wiring segment 350b and aligned in parallel to the wiring segment 350c may be coupled to the wiring segments 350b. In some embodiments, a plurality of wiring segments 350c coupled to the clock drivers 351c in the side regions 320a and 320b on a same line may be coupled to each other. In another embodiments, a plurality of wiring segments 350c coupled to the clock drivers 351c in the side regions 320a and 320b on a same line may be decoupled from each other. The wiring segment 350a may be coupled to the clock driver 351a and the clock drivers 351b on the semiconductor layer at around the center region 310 and at the side regions 320a and 320b on the side 301d, respectively. The wiring segment 350b in the side region 320a may be coupled to the clock driver 351b in the side region 320a at around the side 301d on the semiconductor layer. The wiring segment 350b may be further coupled to the clock driver 351c in the side region 320a, disposed in the direction 390a from the clock driver 351b in the side region 320a, on the semiconductor layer. Similarly, the wiring segment 350b in the side region 320b may be coupled to the clock driver 351b at around the side 301d on the semiconductor layer. The wiring segment 350b may be further coupled to the clock driver 351c in the side region 320b, disposed in the direction 390a from the clock driver 351b in the side region 320b, on the semiconductor layer.

Figure 5:
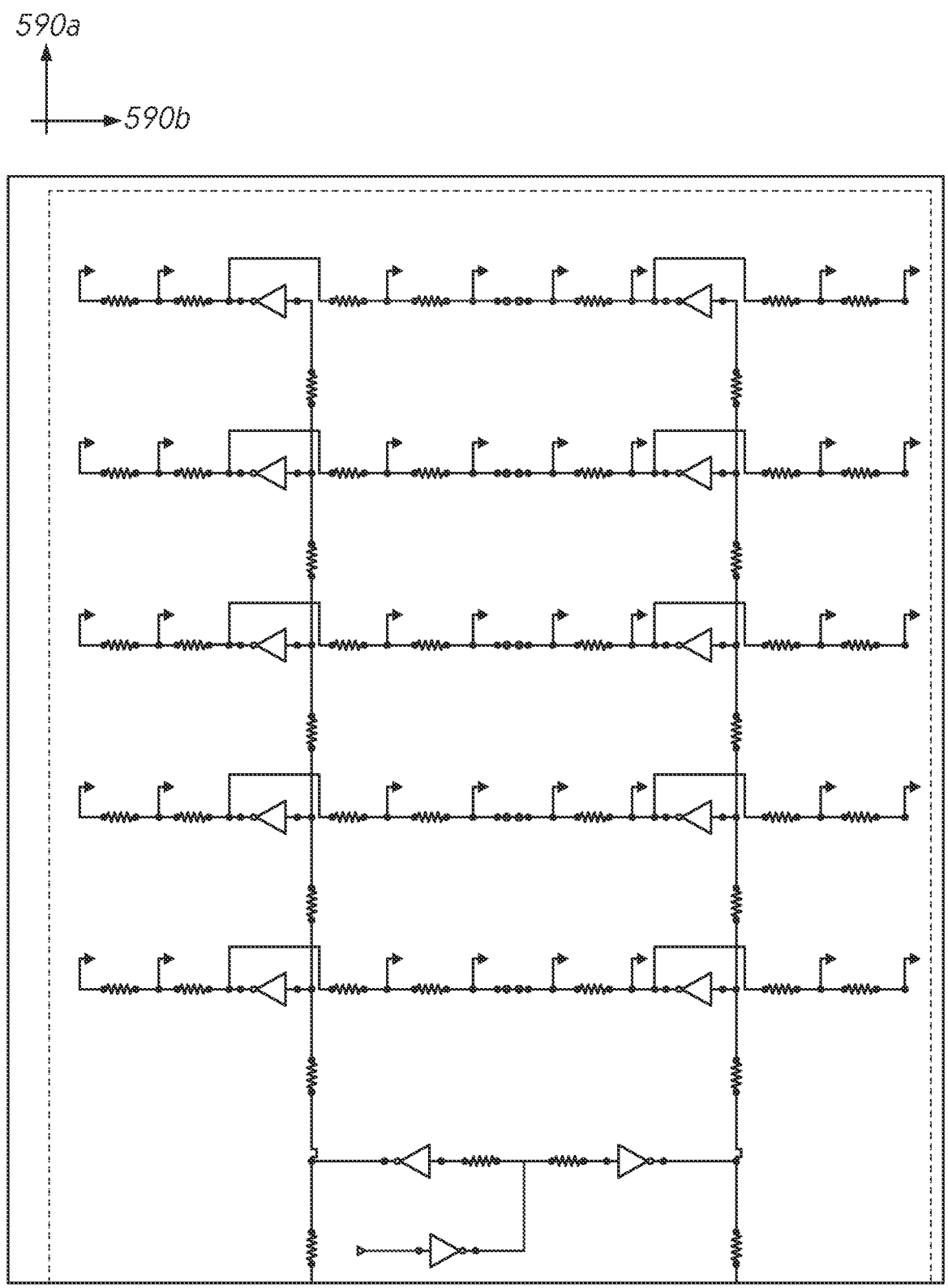
FIG. 5 is a circuit diagram of an H type clock tree in accordance with an embodiment of the present disclosure.

The portion 350 of the clock signal lines having the wiring segment 350a in the direction 390b perpendicular to the direction 390a, and further having the wiring segments 350b in the direction 390a may be referred to as an H type clock tree. The wiring segment 350a may provide the other plurality of clock signals from the clock driver 351a in the center region 310 to the clock drivers 351b in the side region 320a and 320b. The wiring segments 350b may provide the other plurality of clock signal from the clock drivers 351b to the DQ core cells 380-383 and 383-387 towards the side 301c. FIG. 5 is a circuit diagram of the H type clock tree in accordance with an embodiment of the present disclosure.

As illustrated by the previous description, the wiring segments 330a and 340a in the direction 390a may be disposed in the center region 310 whereas the wiring segments 350a in the direction 390a may be disposed in the side regions 320a and 320b. The clock drivers 331b and 341b may be disposed in the center region 310 whereas the clock drivers 351c may be disposed in the side regions 320 and 320b.

Figure 3B:
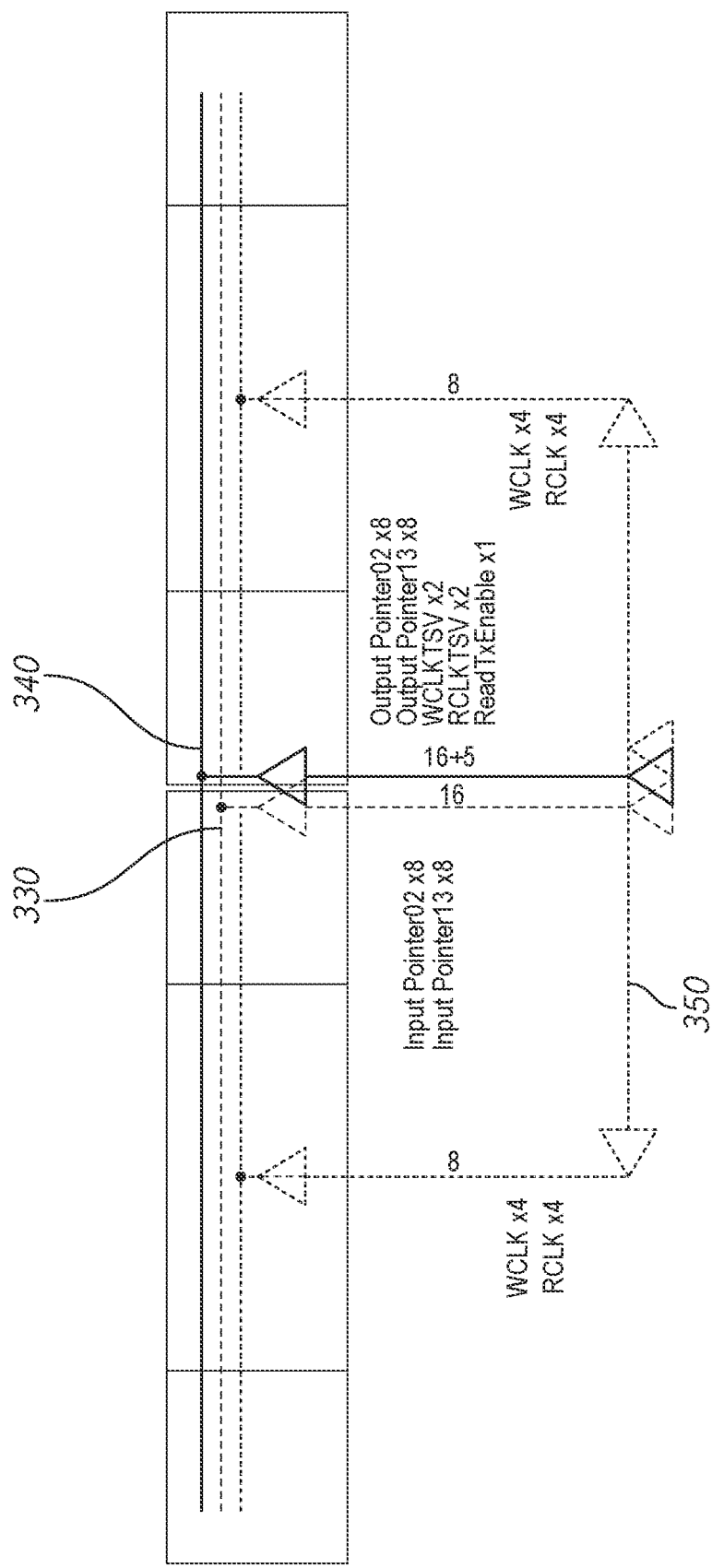
FIG. 3B is a layout diagram of the clock trees including a plurality of clock signal lines on the memory core chip in accordance with an embodiment of the present disclosure.

FIG. 3B is a layout diagram of the clock trees including the plurality of clock signal lines 330, 340 and 350 on the memory core chip in accordance with an embodiment of the present disclosure. For example, the portion 330 of the plurality of clock signal lines as I type clock trees may include 16 signal lines that may transmit eight input pointer 02 signals and eight input pointer 13 signals which may be used for controlling the timing of a read FIFO circuit (e.g., the read FIFO circuit 203) in the memory core chip (e.g., the memory core chip 230). The portion 340 of the plurality of clock signal lines as I type clock trees may include 16 signal lines that may transmit eight output pointer 02 signals and eight output pointer 13 signals. The eight output pointer 02 signals and eight output pointer 13 signals may also be used for controlling the timing of the read FIFO circuit in the memory core chip. Five signal lines may transmit two write clock signals (WCLKTSV), two read clock signals (RCLKTSV), and a read transmission enable signal ReadTxEnable. The two WCLKTSV signals are for through substrate vias (TSVs) that may interconnect the I/F chip (e.g., the I/F chip 220) and the memory core chip. The two RCLKTSV signals are for TSVs that may interconnect the I/F chip and the memory core chip. The portion 350 of the plurality of clock signal lines as H type clock trees may include four signal lines that may transmit two write clock signals (WCLK) within the memory core chip and two read clock signals (RCLK) within the memory core chip.

Figure 3C:
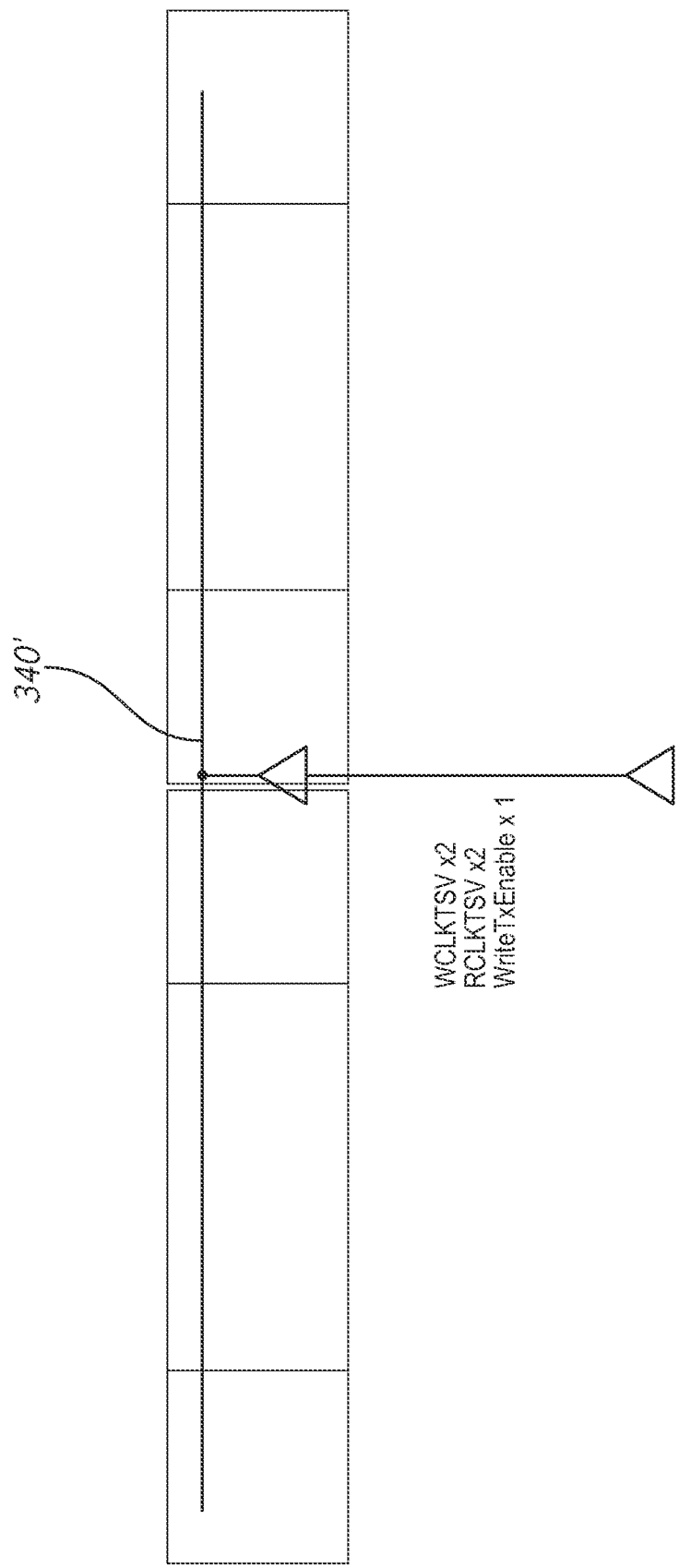
FIG. 3C is a layout diagram of a clock tree including a plurality of clock signal lines on an interface (I/F) chip in accordance with an embodiment of the present disclosure.

FIG. 3C is a layout diagram of a clock tree including a plurality of clock signal lines 340' on an I/F chip in accordance with an embodiment of the present disclosure. As mentioned earlier, the memory/F chip may be the I/F chip 220. For example, the plurality of clock signal lines 340' as I type clock trees may include five signal lines to transmit two write clock signals (WCLKTSV), the read clock signals (RCLKTSV), and a write transmission enable signal WriteTxEnable that may be provided to the transmitter Tx 225. The two write clock signals (WCLKTSV) are for TSVs (e.g., the TSVs 210) in order to interconnect the I/F chip and the memory core chip (e.g., the core chip 230) that may be provided to the I/F chip (e.g., the flip-flop circuit 223 in the I/F chip 220) and the memory core chip (e.g., the receiver 206 in the memory core chip 230). The read clock signals (RCLKTSV) are for the TSVs that may be provided to the I/F chip (e.g., the receiver Rx 226 in the I/F chip 220) and the memory core chip (e.g., the parallel to serial converter 204 in the memory core chip 230).

The example above described with reference to FIGS. 3A-3C is merely an example. The selection of the clock tree type for each signal line may depend on several factors. For example, a clock tree type of the write clock signals (WCLKTSV) for TSVs on a memory core chip may be chosen to be the same as a clock tree type of write clock signals (WCLKTSV) for TSVs of an I/F chip coupled to the memory core chip. Similarly, a clock tree type of the read clock signals (RCLKTSV) for TSVs on the memory core chip may be chosen to be the same as a clock tree type of read clock signals (RCLKTSV) for TSVs of an VF chip coupled to the memory core chip.

Since the portion 340 of the plurality of clock signal lines partially provides the same plurality of WCLKTSV and RCLKTSV signals as the portion 340' provides on the I/F chip, the same I type clock trees may be adopted for the portion 340 on the memory core chip. In addition, the I-type clock tree may be adopted for the clock tree types of the WCLKTSV and RCLKTSV signals on the memory core chip and the I/F chip in order to reduce wirings of the I/F chip. A clock tree type of the read transmission enable signal ReadTxEnable on the memory core chip may be chosen to be the same as a clock tree type of the write transmission enable signal WriteTxEnable. In addition, the I-type clock tree may be adopted for the clock tree types of the ReadTxEnable and WriteTxEnable signals in order to reduce wirings of the I/F chip.

Since the H type clock trees may use a larger number of wiring channels than the I type clock trees use, a large number of signal lines may adopt I type clock trees. For example, a number of input pointer 02 signals, input pointer 13 signals, output pointer 02 signals and output pointer 13 signals may be a total of 32, thus I type clock trees may be preferred to the H type clock trees. From the circuit diagrams of FIGS. 4 and 5, the H type clock tree in FIG. 5 includes side regions including two wiring segments that extend in a direction 590a and a number of clock drivers for each wiring segment of the two wiring segments to drive the same number of wiring segments that extend in a direction 590b to the DQ core cells. In comparison, the I type clock tree in FIG. 4 includes one center region including one wiring segment that extends in a direction 490a and a plurality of clock drivers for a plurality of corresponding wiring segments that extend in a direction 490b to drive the wiring segments to the DQ core cells. Thus, the H type clock tree may include a greater number of wiring segments (e.g., wirings) and clock drivers than the I type clock tree may include.

Figure 3D:
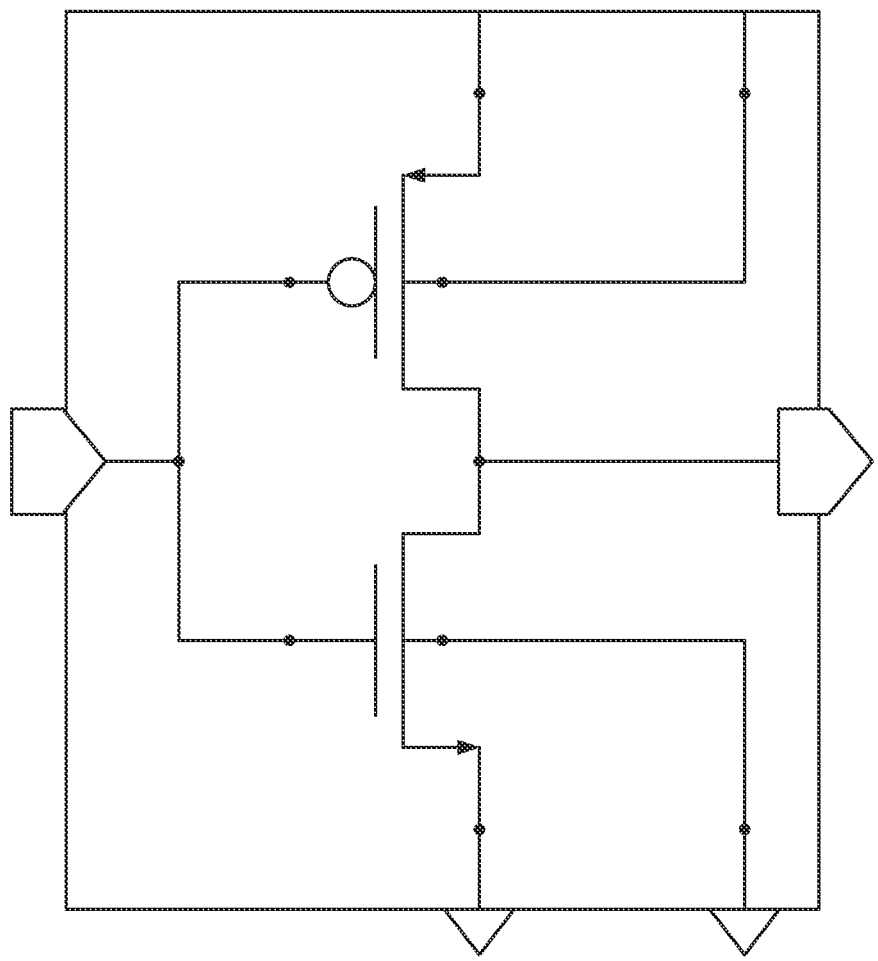
FIG. 3D is a circuit diagram of a clock driver in a semiconductor layer in accordance with an embodiment of the present disclosure.

FIG. 3D is a circuit diagram of a clock driver in a semiconductor layer in accordance with an embodiment of the present disclosure. For example, the clock driver may be an inverter including at least one a P-channel MOS transistor and at least one N-channel MOS transistor that may constitute any clock driver of the clock drivers 331a, 331b, 341a, 341b, 351a, 351b and 351c in FIG. 3A. Since a plurality of the clock drivers of one region may occupy a considerable layout area, having the plurality of clock drivers disposed in a distributed manner among the center region 310 and the side regions 320a and 320b may alleviate congestion in any of the regions. For example, the drive capability of each clock driver may be enhanced in either the center region or the side region with less congestion without extra width of the region in the direction 390b, if some of clock drivers may be disposed in the region different from the other clock drivers and thus each clock driver disposed may be larger.

Figure 6:
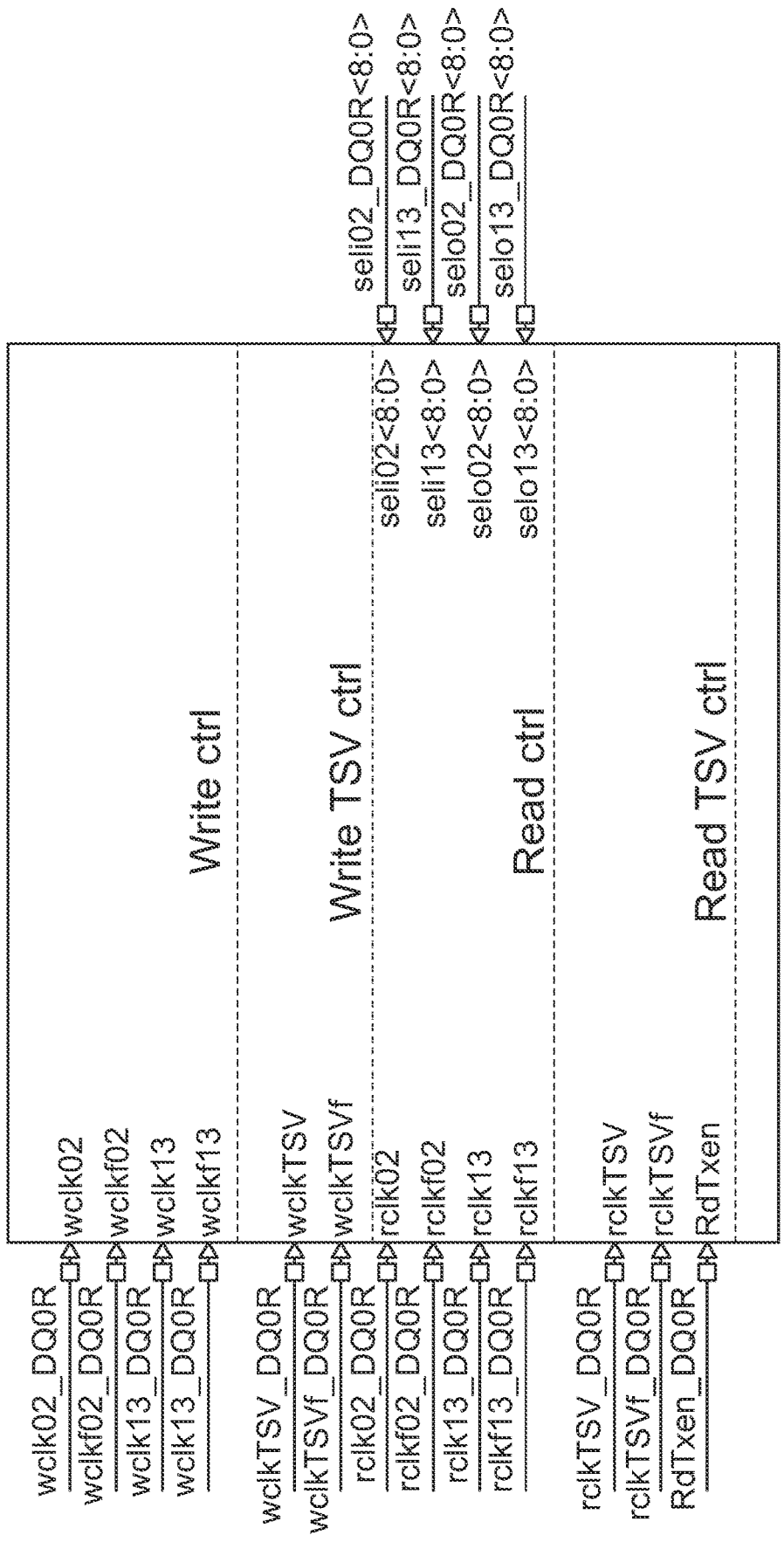
FIG. 6 is a schematic diagram of a portion of DQ core cell of a memory core chip in accordance with an embodiment of the present disclosure.

FIG. 6 is a schematic diagram of a portion of DQ core cell 600 of a memory core chip in accordance with an embodiment of the present disclosure. The DQ core cell 600 may be any of the DQ core cells 380-387. For example, two pairs of complementary write clock signals, wclk02_DQ0R and wclkf02_DQ0R, and wclk13_DQ0R and wclkf13_DQ0R, may be received at pins wclk02, wclksf02, wclk13 and wclksf13. Similarly, two pairs of complementary read clock signals, rck02_DQ0R and rclkf02_DQ0R, and rclk13_DQ0R and rclkf13_DQ0R, may be received at pins rclk02, rclksf02, rclk13 and rclksf13. As for clock signals transmitted through the TSVs, a pair of complementary write clock signals wclkTSV_DQ0R and wclkTSVf_DQ0R and a pair of complementary read clock signals rclkTSV_DQ0R and rclkTSVf_DQ0R may be received at pins wckTSV, wclkTSVf, rclkTSV and rclkTSVf. The read transmission enable signal RdTxen_DQ0R may be received at a pin RdTxen. Input pointer signals seli02_DQ0R<8:0> and seli3_DQ0R<8:0> may be received at pins seli02<8:0> and seli13<8:0>. Output pointer signals selo02_DQ0R<8:0> and selo32_DQ0R<8:0> may be received at pins selo02<8:0> and selo13<8:0>. Pin assignments shown in FIG. 6 is merely an example. The assignments may be adjusted accordingly to internal circuit configuration and outside layout configuration.

Figure 7A:
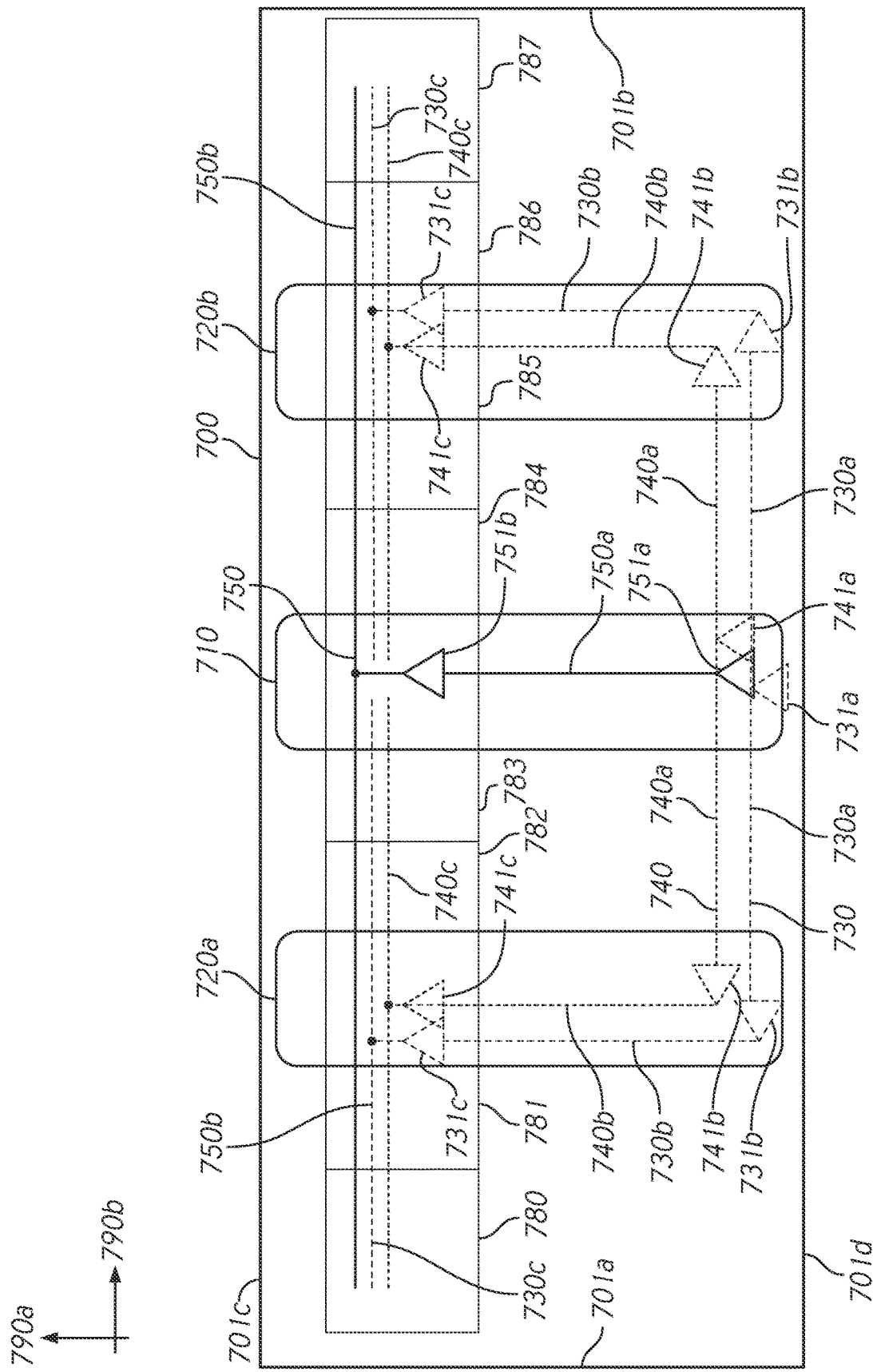
FIG. 7A is a layout diagram of clock trees of a memory core chip in accordance with an embodiment of the present disclosure.

FIG. 7A is a layout diagram of clock trees on a portion 700 of a data queue (DQ) block of a memory core chip in accordance with an embodiment of the present disclosure. For example, the memory core chip may be the memory core chip 230. The portion 700 of the memory core chip may include sides 701a and 701b that may extend in a first direction 790a. The portion 700 of the memory core chip may also include sides 701c and 701d that may extend in a direction 790b that is perpendicular to the first direction 790a. The portion 700 of the memory core chip may include a center region 710, side regions 720a and 720b disposed between the sides 701c and 701d. The center region 710 may be disposed between the side regions 720a and 720b. The side region 720a may be disposed between the side 701a and the center region 710. The side region 720b may be disposed between the side 701b and the center region 710. The portion 700 of the memory core chip may include a plurality of data queue (DQ) core cells 780-787 for receiving or providing data. The portion 700 of the DQ block may include a plurality of clock signal lines 730, 740 and 750. The plurality of clock signal lines 730, 740 and 750 may be included in a wiring layer that includes one or more metal layers.

A portion 730 of the clock signal lines including wirings on one or more metal layers (e.g. Metal1, Metal2, Metal3) may be an H type clock tree. The portion 730 may include a wiring segment 730a that may extend in directions perpendicular to the direction 790a. For example, the wiring segment 730a may extend in the direction opposite to a direction 790b and in the direction 790b from the center region 710 to the side regions 720a and 720b to provide a plurality of clock signals from a clock driver 731a to clock drivers 731b. The clock drivers 731b may provide the plurality of clock signals on wiring segments 730b that may extend in the direction 790a in the side regions 720a and 720b to clock drivers 731c in the side regions 720a and 720b. The portion of 730 of the clock signal lines may further include wiring segments 730c coupled to the clock drivers 731c.

For example, the wiring segment 730c coupled to the clock driver 731c in the side region 720a may extend in the directions perpendicular to the direction 790a, including the direction opposite to the direction 790b and the direction 790b from the side region 720a to the side 701a and the center region 710. Thus, the clock driver 731c in the side region 720a may provide the plurality of clock signals from the wiring segment 730b in the side region 720a to the DQ core cells 780 and 781 via the wiring segment 730c, which is coupled to the clock driver 731c in the side region 720a. The clock driver 731c in the side region 720a may further provide the plurality of clock signals from the wiring segment 730b in the side region 720a to the DQ core cells 782 and 783 via the wiring segment 730c coupled to the clock driver 731c in the side region 720a.

Similarly, the wiring segment 730c coupled to the clock driver 731c in the side region 720b may extend in the directions perpendicular to the direction 790a, including the direction opposite to the direction 790b and the direction 790b from the side region 720b to the center region 710 and the side 701b. Thus, the clock driver 731c in the side region 720b may provide the plurality of clock signals from the wiring segment 730b in the side region 720b to the DQ core cells 784 and 785 via the wiring segment 730c coupled to the clock driver 731c in the side region 720b. The clock driver 731c in the side region 720b may further provide the plurality of clock signals from the wiring segment 730b in the side region 720a to the DQ core cells 786 and 787 via the wiring segment 730c coupled to the clock driver 731c in the side region 720b.

Similarly to the H type clock tree shown in FIG. 5, a plurality of wiring segments perpendicular to the wiring segment 730b and aligned in parallel to the wiring segment 730c may be coupled to the wiring segments 730b. In some embodiments, a plurality of wiring segments 730c coupled to the clock drivers 731c in the side regions 720a and 720b on a same line may be coupled to each other. In another embodiments, a plurality of wiring segments 730c coupled to the clock drivers 731c in the side regions 720a and 720b on a same line may be decoupled from each other. The wiring segment 730a may be coupled to the clock driver 731a and the clock drivers 731b on the semiconductor layer at around the center region 710 and at the side regions 720a and 720b respectively, at around the side 701d. The wiring segment 730b in the side region 720a may be coupled to the clock driver 731b at around the side 701d and the clock driver 731c disposed in the direction 790a from the clock driver 731b, in the side region 720a on the semiconductor layer, respectively. The wiring segment 730b in the side region 720b may be coupled to the clock driver 731b at around the side 701d and the clock driver 731c disposed in the direction 790a from the clock driver 731b in the side region 720b on the semiconductor layer. The portion 730 of the clock signal lines of the H type clock tree includes the wiring segment 730a in the direction 790b that provides the plurality of clock signals from the clock driver 731a in the center region 710 to the clock drivers 731b in the side region 720a and 720b, and the wiring segments 730b in the direction 790a that provide the plurality of clock signal from the clock drivers 731b to the DQ core cells 780-783 and 783-787.

A portion 740 of the clock signal lines including wirings on one or more metal layers (e.g. Metal1, Metal2, Metal3) may be an H type clock tree as similar to the portion 730. As such, a detailed description of layout of components in the H type clock tree of the portion 740 will not be repeated in the interest of brevity. The portion 740 may include a wiring segment 740a that may extend in directions perpendicular to the direction 790a. For example, the wiring segment 740a may extend in the direction in the direction opposite to a direction 790b and in the direction 790b from the center region 710 to the side regions 720a and 720b to provide another plurality of clock signals, different from the plurality of clock signals, from a clock driver 741a to clock drivers 741b. The clock drivers 741b may provide the other plurality of clock signals on wiring segments 740b that may extend in the direction 790a in the side regions 720a and 720b to clock drivers 741c in the side regions 720a and 720b. The portion of 740 of the clock signal lines may further include wiring segments 740c coupled to the clock drivers 741c.

For example, the wiring segments 740c coupled to the clock driver 741c in the side region 720a may extend in the directions, including the direction opposite to the direction 790b and the direction 790b. Thus, the clock drivers 741c in the side regions 720a and 720b may provide the other plurality of clock signals from the wiring segment 740b to the DQ core cells 780-787 via the wiring segments 740c. Similarly to the H type clock tree shown in FIG. 5, a plurality of wiring segments perpendicular to the wiring segment 740b and aligned in parallel to the wiring segment 740c may be coupled to the wiring segments 740b. In some embodiments, a plurality of wiring segments 740c coupled to the clock drivers 741c in the side regions 720a and 720b on a same line may be coupled to each other. In another embodiments, a plurality of wiring segments 740c coupled to the clock drivers 741c in the side regions 720a and 720b on a same line may be decoupled from each other. The clock drivers 741a in the center region 710, and 741b and 741c in the side regions 720a and 720b may be on the semiconductor layer. Thus, the portion 740 of the clock signal lines of the H type clock tree includes the wiring segment 740a in the direction 790b that provides the other plurality of clock signals from the clock driver 741a in the center region 710 to the clock drivers 741b in the side region 720a and 720b, and the wiring segments 740b in the direction 790a that provide the other plurality of clock signal from the clock drivers 741b to the DQ core cells 780-783 and 783-787.

A portion 750 of the clock signal lines, including wirings on one or more metal layers (e.g. Metal1, Metal2, Metal3), may be an I type clock tree that includes a wiring segment 750a that may extend in the direction 790a in the center region 710 and a wiring segment 750b that may extend in directions perpendicular to the direction 790a. For example, the wiring segment 750b may extend in the direction opposite to the direction 790b and in the direction 790b from the center region 710 to the side regions 720a and 720b. The wiring segment may provide another plurality of clock signals, different from any of the plurality of clock signals provided by the portions 730 and 740 of the clock signal lines, to the plurality of DQ core cells 780-783 and 784-787, respectively. The wiring segment 750b is shown as one wiring segment in FIG. 7A, however, the portion 750 may include a plurality of wiring segments perpendicular to the wiring segment 750a and aligned in parallel to the wiring segment 750b, as shown in FIG. 4. The wiring segment 750a may be coupled to a clock driver 751a. In some embodiments of the disclosure, the wiring segment 750a may be coupled to the clock driver 751a at around the sides 701d in the center region 710. The wiring segment 750a may be further coupled to a clock driver 751b in the direction 790a from the clock driver 751a in the center region 710, on the semiconductor layer. The wiring segment 750a may provide the other plurality of clock signals from the clock driver 751a to the clock driver 751b in the center region 710. The wiring segment 750b may provide the other plurality of clock signal from the clock driver 751b in the center region to the DQ core cells 780-783 and 783-787 towards the sides 701a and 701b.

As illustrated by the previous description, the wiring segments 750a in the direction 790a may be disposed in the center region 710 whereas the wiring segments 730a and 740a in the direction 790a may be disposed in the side regions 720a and 720b. The clock driver 750b may be disposed in the center region 710 whereas the clock drivers 731c and 741c may be disposed in the side regions 720 and 720b.

Figure 7B:
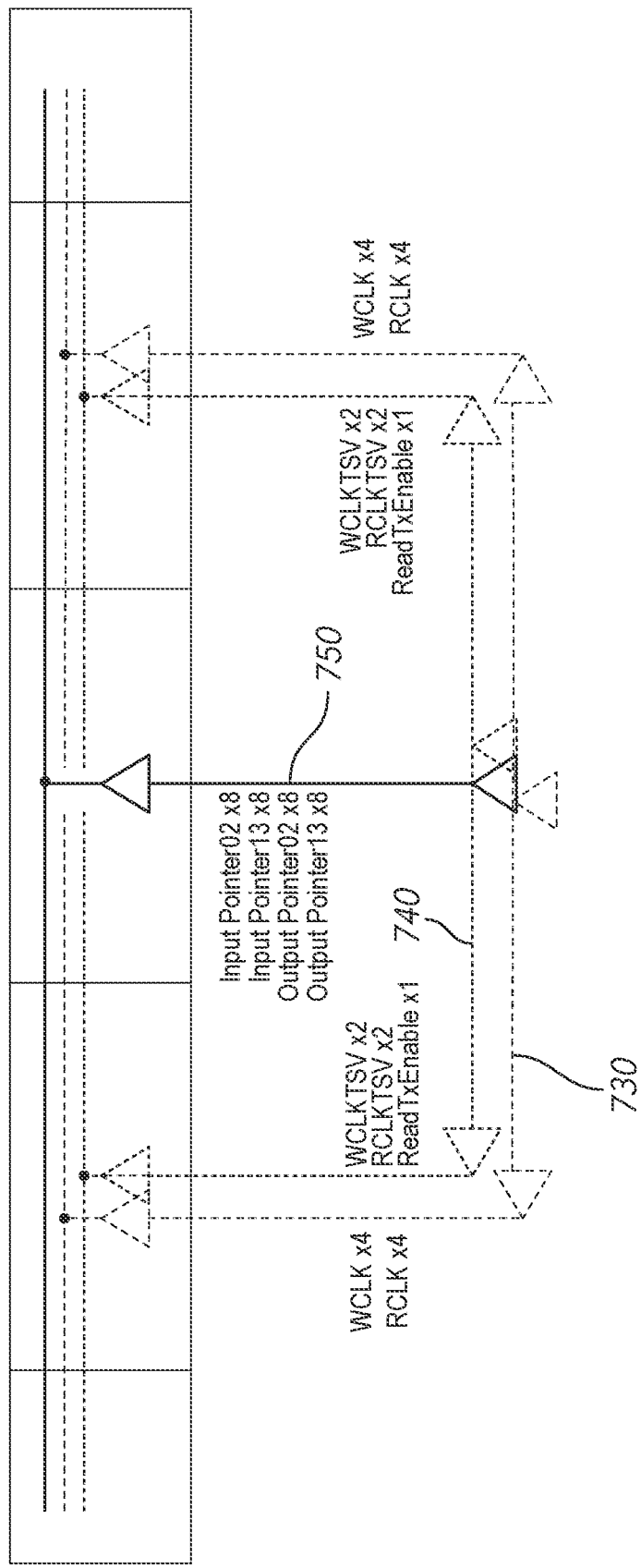
FIG. 7B is a layout diagram of the clock trees including a plurality of clock signal lines on the memory core chip in accordance with an embodiment of the present disclosure.

FIG. 7B is a layout diagram of the clock trees including the plurality of clock signal lines 730, 740 and 750 on the memory core chip in accordance with an embodiment of the present disclosure. For example, The portion 730 of the plurality of clock signal lines as H type clock trees may include four signal lines that may transmit four write clock signals (WCLK) within the memory core chip and four read clock signals (RCLK) within the memory core chip. The portion 740 of the plurality of clock signal lines as H type clock trees may include five signal lines to transmit two write clock signals (WCLKTSV), two read clock signals (RCLKTSV), and a read transmission enable signal ReadTxEnable. The two WCLKTSV signals are for through substrate vias (TSVs) that may interconnect the I/F chip (e.g., the I/F chip 220) and the memory core chip. The two read RCLKTSV signals are for TSVs that may interconnect the I/F chip and the memory core chip. The portion 750 of the plurality of clock signal lines as I type clock trees may include 32 signal lines that may transmit eight input pointer 02 signals, eight input pointer 13 signals, eight output pointer 02 signals and eight output pointer 13 signals. The eight output pointer 02 signals and eight output pointer 13 signals may be used for controlling the timing of a read FIFO circuit (e.g., the read FIFO circuit 203) in the memory core chip (e.g., the memory core chip 230).

Figure 7C:
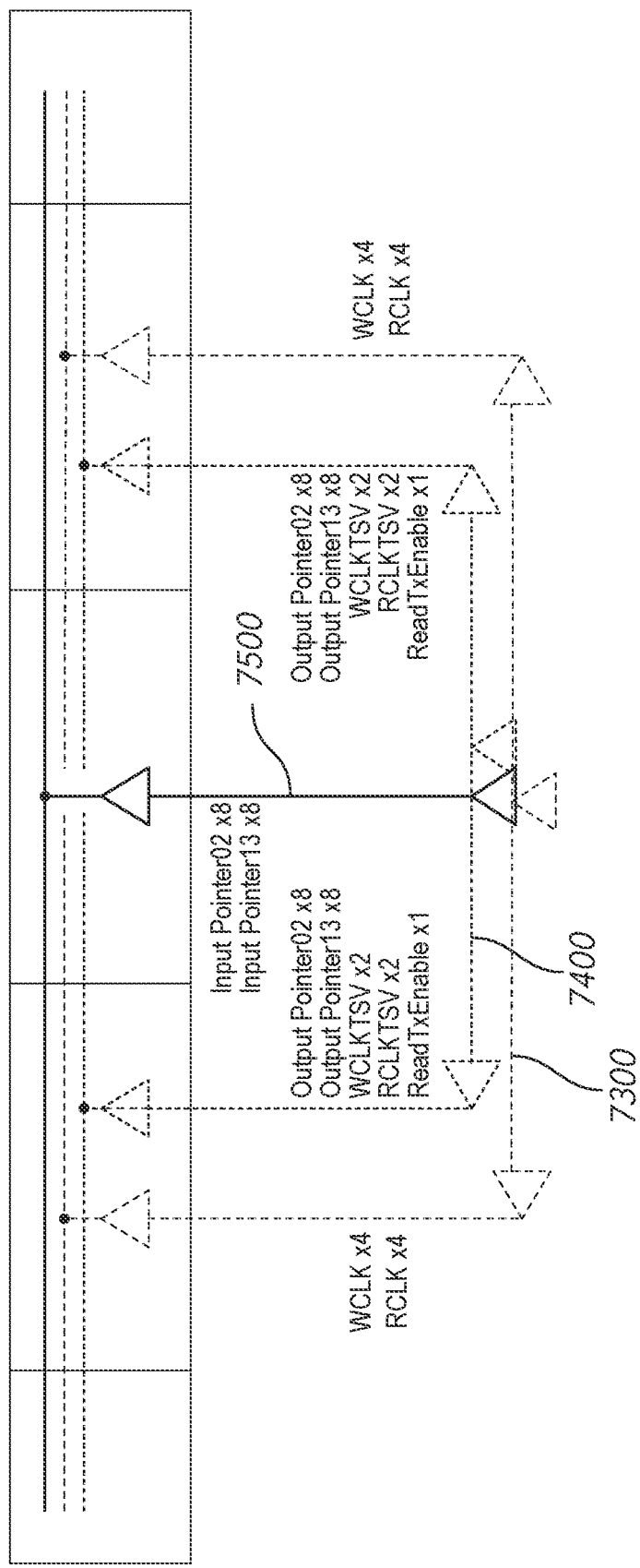
FIG. 7C is a layout diagram of the clock trees including a plurality of clock signal lines on the memory core chip in accordance with an embodiment of the present disclosure.

FIG. 7C is a layout diagram of the clock trees including the plurality of clock signal lines 7300, 7400 and 7500 on the memory core chip in accordance with an embodiment of the present disclosure. The portions 7300, 7400 of the plurality of clock signal lines may be H type clock trees and the portion 7500 of the plurality of clock signal lines may be an I type clock tree, as similar to the portions 730, 740 and 750. As such, a detailed description of layout of components in the portions 7300, 7400 and 7500 will not be repeated in the interest of brevity. The portion 7400 of the plurality of clock signal lines may provide clock signals related to TSV data transmissions. For example, the portion 7400 of the plurality of clock signal lines may further include sixteen signal lines for eight output pointer 02 signals and eight output pointer 13 signals in addition to the five clock signals, namely, two WCLKTSV signals, two RCLKTSV signals and the ReadTxEnable signals. Thus, the portion 7500 of the plurality of clock signal lines may not include the sixteen signal lines for transmitting eight output pointer 02 signals and eight output pointer 13 signals.

Figure 7D:
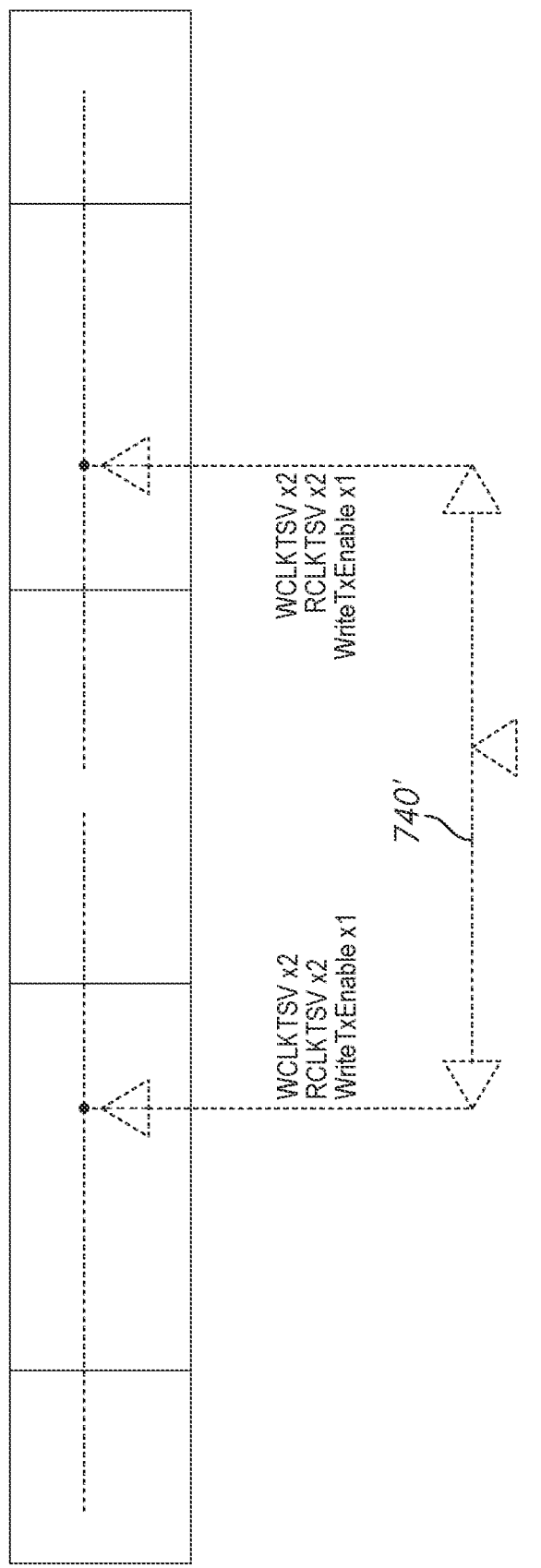
FIG. 7D is a layout diagram of a clock tree including a plurality of clock signal lines on an I/F chip in accordance with an embodiment of the present disclosure.

FIG. 7D is a layout diagram of a clock tree including a plurality of clock signal lines 740' on an I/F chip in accordance with an embodiment of the present disclosure. As mentioned earlier, the I/F chip may be the I/F chip 220. For example, the plurality of clock signal lines 740' as H type clock trees may include five signal lines to transmit two write clock signals (WCLKTSV) for TSVs (e.g., the TSVs 210) in order to interconnect the I/F chip and the memory core chip (e.g., the core chip 230) that may be provided to the I/F chip (e.g., the flip-flop circuit 223 in the IF chip 220) and the memory core chip (e.g., the receiver 206 in the memory core chip 230), the read clock signals (RCLKTSV) for the TSVs that may be provided to the I/F chip (e.g., the receiver Rx 226 in the I/F chip 220) and the memory core chip (e.g., the parallel to serial converter 204 in the memory core chip 230), and a write transmission enable signal WriteTxEnable that may be provided to the transmitter Tx 225.

The example above with referring to FIGS. 7A-7C is merely an example. The selection of the clock tree type for each signal line may depend on several factors. For example, a clock tree type of the write clock signals (WCLKTSV) for TSVs on a memory core chip may be chosen to be the same as a clock tree type of write clock signals (WCLKTSV) for TSVs of an I/F chip coupled to the memory core chip. Since the portion 740 of the plurality of clock signal lines partially provides the same plurality of WCLKTSV and RCLKTSV signals as the portion 740' provides on the I/F chip, the same H type clock trees may be adopted for the portion 740 on the memory core chip. Similarly, a clock tree type of the read clock signals (RCLKTSV) for TSVs on the memory core chip may be chosen to be the same as a clock tree type of read clock signals (RCLKTSV) for TSVs of an I/F chip coupled to the memory core chip. A clock tree type of the read transmission enable signal ReadTxEnable on the memory core chip may be chosen to be the same as a clock tree type of the write transmission enable signal WriteTxEnable.

As explained earlier referring to FIGS. 3A-3C, since the H type clock trees may use a larger number of wiring channels, including wirings and clock drivers, than the I type clock trees normally use, a large number of signal lines may adopt I type clock trees. For example, a number of input pointer 02 signals, input pointer 13 signals, output pointer 02 signals and output pointer 13 signals may be a total of 32, thus I type clock trees as shown in the portion 750 may be preferred to the H type clock trees.

Although various embodiments have been disclosed, it will be understood by those skilled in the art that the disclosure extends beyond the specifically disclosed embodiments to other alternative embodiments and/or uses of the embodiments and obvious modifications and equivalents thereof. In addition, other modifications which are within the scope of the disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

What is claimed is:

1. An apparatus comprising a chip including:
   a first side and a second side extending in a first direction;
   a center region disposed between the first and second sides;
   a side region disposed between the center region and the first side;
   a first clock driver disposed in the center region;
   a second clock driver disposed in the center region;
   a third clock driver disposed in the side region;
   a first clock signal line including:
      a first wiring segment extending in the center region and coupled to the first clock driver and configured to provide a first plurality of clock signals from the first clock driver; and
   a second clock signal line including:
      a second wiring segment extending from the center region to the side region and coupled to the second clock driver and further coupled to the third clock driver, and configured to provide a second plurality of clock signals from the second clock driver to the third clock driver.

2. The apparatus of claim 1, wherein the chip is a memory core chip comprising a plurality of data queue (DQ) core cells configured to receive or provide data, and
   wherein the second clock signal line further comprises a third wiring segment coupled to the third clock driver and extending to the plurality of DQ core cells.

3. The apparatus of claim 1, wherein the first clock driver is configured to drive the first plurality of clock signals and the second clock driver is configured to drive the second plurality of clock signals different from the first plurality of clock signals.

4. The apparatus of claim 3, further comprising a fourth clock driver disposed in the center region and coupled to the first wiring segment,
   wherein the chip is a memory core chip comprising a plurality of data queue (DQ) core cells configured to receive or provide data, and
   wherein the first clock signal line further comprises:
      a fourth wiring segment coupled to the fourth clock driver and extending to the plurality of DQ core cells.

5. The apparatus of claim 3, wherein the chip is a memory core chip, and
   wherein the second plurality of clock signals include at least one of a write clock signal or a read clock signal.

6. The apparatus of claim 5, further comprising:
   an interface chip; and
   one or more vias, each via configured to interconnect the interface chip and the memory core chip,
   wherein the first clock driver is configured to receive the first plurality of clock signals from the interface chip through the vias, and further configured to drive the first wiring segment.

7. The apparatus of claim 6, wherein the interface chip comprises a third wiring segment extending in the first direction and configured to provide the first plurality of clock signals.

8. The apparatus of claim 5, wherein the first plurality of clock signals include one or more first pointer signals.

9. The apparatus of claim 8, wherein the chip further comprises:
   a third wiring segment extending in the center region; and
   a pointer driver disposed in the center region and coupled to the third wiring segment, and configured to drive one or more second pointer signals different from the one or more first pointer signals.

10. An apparatus comprising a chip including:
    a first side and a second side extending in a first direction;
    a center region disposed between the first and second sides;
    a side region disposed between the center region and the first side;
    a first driver disposed in the center region;
    a second driver disposed in the center region;
    a third driver disposed in the side region;
    a first signal line including:
       a first wiring segment extending in the center region and coupled to the first driver; and
    a second signal line including:
       a second wiring segment extending from the center region to the side region and coupled to the second driver and further coupled to the third driver, and configured to provide one or more clock signals from the second driver to the third driver.

11. The apparatus of claim 10, wherein the first driver is configured to drive one or more pointer signals.

12. The apparatus of claim 11, wherein the second driver is configured to drive the one or more clock signals.

13. The apparatus of claim 12, further comprising:
    a fourth driver disposed in the center region;
    a fifth driver disposed in the side region; and
    a third signal line including:
       a third wiring segment extending from the center region to the side region and coupled to the fourth clock driver and further coupled to the fifth clock driver.

14. The apparatus of claim 13, further comprising an interface chip configured to provide one or more via clock signals,
    wherein the fourth driver is configured to receive the one or more via clock signals.

15. The apparatus of claim 14, wherein the interface chip comprises:
    a third side and a fourth side extending in a first direction;
    a first region disposed between the third and fourth sides;
    a second region disposed between the first region and the third side;
    a fourth wiring segment extending from the first region to the second region;
    a sixth driver disposed in the center region and coupled to the fourth wiring segment, and configured to drive the one or more via clock signals; and
    a seventh driver disposed in the side region and coupled to the fourth wiring segment.

16. An apparatus comprising one or more memory core chips, wherein each memory core chip of the one or more memory core chips comprises:
    a first side and a second side extending in a first direction;
    a center region disposed between the first and second sides;
    a side region disposed between the center region and the first side;
    a first clock driver disposed in the center region and configured to drive one or more first clock signals;
    a second clock driver disposed in the center region and configured to drive one or more second clock signals;
    a third clock driver disposed in the side region and configured to drive the one or more second clock signals;
    a first clock signal line including:
       a first wiring segment extending in the center region and coupled to the first clock driver, and
    a second clock signal line including:
       a second wiring segment coupled to the second clock driver and the third clock driver, and configured to provide the one or more second clock signals from the second clock driver to the third clock driver.

17. The apparatus of claim 16, further comprising:
    an interface chip configured to receive a clock signal from a memory controller and further configured to provide one or more clock signals; and
    one or more vias configured to receive the one or more clock signals from the interface chip and further configured to provide the one or more clock signals to the one or more memory core chips,
    wherein the first clock driver is configured to receive the one or more via clock signals and further configured to drive the one or more via clock signals as the one or more first clock signals.

18. The apparatus of claim 17, wherein the interface chip comprises:
    a fourth clock driver configured to drive the one or more via clock signals; and
    a third wiring segment extending in the first direction and coupled to the fourth clock driver.

19. The apparatus of claim 16, further comprising:
    an interface chip configured to receive a clock signal from a memory controller and further configured to provide one or more via clock signals; and
    one or more vias configured to receive the one or more via clock signals from the interface chip and further configured to provide the one or more via clock signals to the one or more memory core chips,
    wherein the second clock driver is configured to receive the one or more via clock signals and further configured to drive the one or more via clock signals as the one or more second clock signals.

20. The apparatus of claim 19, wherein the interface chip comprises:
    a fourth clock driver configured to drive the one or more via clock signals;
    a third wiring segment extending in a second direction perpendicular to the first direction and coupled to the fourth clock driver, and
    a fifth clock driver coupled to the third wiring segment and configured to drive the one or more second clock signals.

* * * * *